(12) United States Patent
Borrelli et al.

(10) Patent No.: US 9,133,545 B2
(45) Date of Patent: Sep. 15, 2015

(54) GLASS-CERAMICS SUBSTRATES FOR GRAPHENE GROWTH

(71) Applicant: Corning Incorporated, Corning, NY (US)

(72) Inventors: Nicholas Francis Borrelli, Elmira, NY (US); Curtis Robert Fekety, Corning, NY (US); Xinyuan Liu, Corning, NY (US); Zhen Song, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 191 days.

(21) Appl. No.: 14/061,342

(22) Filed: Oct. 23, 2013

(65) Prior Publication Data

US 2015/0110998 A1  Apr. 23, 2015

(51) Int. Cl.
| | | |
|---|---|---|
| C23C 16/02 | (2006.01) | |
| C23C 16/26 | (2006.01) | |
| C04B 41/52 | (2006.01) | |
| C04B 41/00 | (2006.01) | |

(52) U.S. Cl.
CPC ............ C23C 16/0218 (2013.01); C04B 41/009 (2013.01); C04B 41/52 (2013.01); C23C 16/26 (2013.01)

(58) Field of Classification Search
None
See application file for complete search history.

(56) References Cited

U.S. PATENT DOCUMENTS

| | | | | |
|---|---|---|---|---|
| 3,420,645 A | * | 1/1969 | Hair ............................ | 65/21.4 |
| 3,464,806 A | * | 9/1969 | Shigeru et al. ............. | 65/32.4 |
| 3,490,887 A | * | 1/1970 | Herczog et al. ............. | 65/33.1 |
| 3,793,605 A | * | 2/1974 | Fehlner ...................... | 338/34 |
| 3,876,407 A | * | 4/1975 | Hirose et al. ................ | 65/30.13 |
| 4,084,972 A | * | 4/1978 | Andrus et al. .............. | 428/410 |
| 4,084,973 A | * | 4/1978 | Andrus et al. .............. | 428/410 |
| 4,414,281 A | * | 11/1983 | Hoda ......................... | 428/433 |
| 4,681,778 A | * | 7/1987 | Young ........................ | 430/600 |
| 4,847,138 A | * | 7/1989 | Boylan et al. .............. | 428/209 |
| 4,892,857 A | * | 1/1990 | Tennent et al. ............. | 502/439 |
| 7,947,581 B2 | | 5/2011 | Ma ............................ | 438/509 |
| 2003/0222560 A1 | | 12/2003 | Roach ........................ | 313/311 |
| 2009/0101964 A1 | | 4/2009 | Choi et al. .................. | 257/324 |
| 2009/0226361 A1 | | 9/2009 | Campos-Delgado et al. .................... | 423/447.2 |

(Continued)

FOREIGN PATENT DOCUMENTS

| | | |
|---|---|---|
| CN | 101462219 | 6/2009 |
| CN | 102757043 A | 10/2012 |
| EP | 2570462 | 3/2013 |

OTHER PUBLICATIONS

Arnold, "Near-surface nucleation and crystallization of an ion-implanted lithia-alumin-silica glass," Journal of Applied Physics, vol. 46, No. 10, Oct. 1975.*

(Continued)

*Primary Examiner* — David Sample
(74) *Attorney, Agent, or Firm* — Zachary J Wegmann

(57) ABSTRACT

An insulating glass-ceramic substrate for synthesizing graphene includes discrete, crystalline, nanophase metallic regions capable of catalyzing graphene growth. The nanophase regions may be formed by thermal treatment of a glass-ceramic substrate containing the corresponding metal oxide. Single layer and double layer graphene are prepared on the modified glass-ceramic substrate in a vacuum chemical vapor deposition (CVD) process from hydrocarbon precursors. The graphene-coated glass-ceramic substrate is electrically conductive.

22 Claims, 8 Drawing Sheets

(56) References Cited

U.S. PATENT DOCUMENTS

| | | |
|---|---|---|
| 2012/0003438 A1 | 1/2012 | Appleton et al. |
| 2012/0012796 A1 | 1/2012 | Chen et al. .................... 252/502 |
| 2012/0241069 A1 | 9/2012 | Hofmann et al. |
| 2012/0282489 A1 | 11/2012 | Shin et al. |

OTHER PUBLICATIONS

Chen et al; "Graphene on Au-Coated Siox Substrate: Its Core-Level Photoelectron Micro-Spectroscopy Study"; Applied Physics Express, Jul. 11, 2012; vol. 5. No. 8; pp. 085101-1-085101-3.

Takami et al; "Graphene Film Formation on Insulating Substrates Using Polymer Films as Carbon Source"; J. Phys. D: Appl. Phys. Feb. 12, 2014; vol. 47L p. 074015 (7 PP).

PCT/US2014/061338 Search Report and Written Opinion.

K.S. Kim et al., "Large-scale pattern growth of grapheme films for stretchable transparent electrodes", Nature, Feb. 2009, vol. 457, pp. 706-710.

Z. Chen, et al, "Bulk growth of mono- to few-layer grapheme on nickel particles by chemical vapor deposition from methane", Carbon, 2010, vol. 48, pp. 3543-3550.

C. Yang, et al., "Directed PECVD growth of vertically erected grapheme walls on dielectric substrates as excellent multifunctional electrodes", Journal of Materials Chemistry A, 2012, pp. 1-6.

K.S. Novoselev, et al., "Electric Field Effect in Atomically Think Carbon Films", Science, Oct. 22, 2004, vol. 306, pp. 666-669.

R. VanNoorden, "The Trials of New Carbon", Nature, Jan. 6, 2011, vol. 469, pp. 14-16.

A.K. Geim, et al., "The rise of grapheme", Nature Materials, Mar. 2007, vol. 6, pp. 183-191.

S. Park, et al., "Chemical methods for production of graphenes", Nature Technology, Apr. 2009, vol. 4, pp. 217-224.

Y. Zhu, et al., "Graphene and Graphene Oxide: Synthesis, Properties, and Applications", Advanced Materials, 2010, vol. 22, pp. 3906-3924.

X. Li, et al., "Large-Area Synthesis of High-Quality and Uniform Graphene Films on Copper Foils", Science, Jun. 5, 2009, vol. 324, pp. 1312-1314.

K.S. Novoselov, et al., "A Roadmap for Graphene", Nature, Oct. 11, 2012, vol. 490, pp. 192-200.

J.S. Bunch, et al., "Electromechanical Resonators from Graphene Sheets", Science, Jan. 26, 2007, vol. 315, pp. 490-493.

A. Kumar, et al., "Direct Synthesis of Lithium-Intercalated Graphene for Electrochemical Energy Storage Application", ACSNANO, 2011, vol. 5, No. 6, pp. 4345-4349.

W. Hu, et al., "Graphene-Based Antibacterial Paper", ACSNANO, 2010, vol. 4, No. 7, pp. 4317-4323.

X. Wang, et al., "N-Doping of Graphene Through Electrothermal Reactions with Ammonia", Sicence, May 8, 2009, vol. 324, pp. 768-772.

Y. Wang, et al., "Nitrogen-Doped Graphene and Its Application in Electrochemical Biosensing", ACSNANO, vol. 4, No. 4, pp. 1790-1798.

F. Bonaccorso, et al., "Graphene photonics and optoelectronics", Nature Photonics, Sep. 2010, vol. 4, pp. 611-622.

S. Bae, et al., "Roll-to-Roll production of 30-inch graphene films for transparent electrodes", Nature Nanotechnology, Advanced Online Publication, Jun. 20, 2010, DOI: 10.1038/NNANO.2010.132, pp. 1-5.

Y. Hernandez, et al., "High-yield production of graphene by liquid-phase exfoliation of graphite", Nature Nanotechnology, Sep. 2008, vol. 3, pp. 563-568.

X. Li, et al., "Highly Conducting Graphene Sheets and Langmuir-Blodgett Films", Nature Nanotechnology, Sep. 2008, vol. 3, pp. 538-542.

K.V. Emtsev, et al., "Towards wafer-size graphene layers by atmospheric pressure graphitization of silicon carbide", Nature Materials, Mar. 2009, vol. 8, pp. 203-207.

Z. Sun, et al., "Growth of graphene from solid carbon sources", Nature, Nov. 25, 2010, vol. 463, pp. 549-552.

S. Unarunotai, et al., "Conjugated Carbon Monolayer Membranes: Methods for Synthesis and Integration", Advanced Materials, 2010, vol. 22, pp. 1072-1077.

H. Medina, et al., "Metal-Free Growth of Nanographene on Silicon Oxides for Transparent Conducting Applications", Advanced Functional Materials, 2012, vol. 22, pp. 2123-2128.

X. Ding, et al., "Direct growth of few layer graphene on hexagonal boron nitride by chemical vapor deposition", Carbon, 2011, vol. 49, pp. 2522-2525.

H.J. Song, et al., "Large scale metal-free synthesis of graphene on sapphire and transfer-free device fabrication", Nanoscale, 2012, vol. 4, pp. 3050-3054.

J. Hwang, et al., "van der Waals Epitaxial Growth of Graphene on Sapphire by Chemical Vapor Deposition without a Metal Catalyst", ACSNANO, 2013, vol. 7, No. 1, pp. 385-395.

A.C. Ferrari, et al., "Raman Spectrum of Graphene and Graphene Layers", Physical Review Letters, Nov. 3, 2006, vol. 97, pp. 187401-1-187401-4.

\* cited by examiner

GLASS-CERAMICS SUBSTRATES FOR GRAPHENE GROWTH

BACKGROUND

1. Field

The present disclosure relates generally to methods for forming graphene, and more specifically glass-ceramic substrates used to synthesize graphene.

2. Technical Background

Graphene is a two-dimensional allotrope of carbon. The structure of graphene includes a single planar sheet of $sp^2$-hybridized carbon atoms arranged in a densely-packed honeycomb array. The carbon-carbon bond length in graphene is about 0.142 nm. A schematic of a graphene monolayer is shown in FIG. 1.

In essence, graphene is an isolated atomic plane of graphite. As a 2-dimensional crystalline material, graphene has unique properties including high intrinsic mobility (200,000 $cm^2V^{-1}s^{-1}$), Young's modulus (~1,100 GPa), breaking strength ($42Nm^{-1}$), fracture strength (~125 GPa), thermal conductivity (~5000 $Wm^{-1}K^{-1}$), surface area (2,630 $m^2g^{-1}$), and an optical transmittance of ~97%. With such remarkable properties, graphene has a wide variety of potential applications that range from nano-electromechanical resonators and high-performance field effect transistors to clean energy devices, sensors and antibacterial products.

Graphene was first isolated via mechanical exfoliation of highly-oriented pyrolytic graphite (HOPG). It is now well-known that tiny fragments of graphene sheets are produced whenever graphite is abraded, such as when drawing with a pencil. Graphene can also be obtained via carbon segregation by heating a carbon source such as silicon carbide to high temperature (>1100° C.) at low pressure (~$10^{-6}$ Torr) to reduce it to graphene.

The lack of a large-scale synthesis route for the production of high-quality graphene at low cost has substantially hampered its proliferation. Accordingly, it would be advantageous to develop an economical method for forming large area graphene.

BRIEF SUMMARY

In accordance with embodiments of the present disclosure, a substrate for graphene growth comprises a glass-ceramic body, and plural nanophase metallic islands disposed on a surface of the glass-ceramic body. The metallic islands can catalyze graphene growth in a CVD process. A method for forming graphene comprises exposing a surface of the glass-ceramic substrate to a carbon precursor.

The result can be a graphene-coated substrate comprising a glass-ceramic body, plural nanophase metallic islands disposed on a surface of the glass-ceramic body, and a graphene layer disposed over the metallic islands. In embodiments, the substrate prior to graphene formation is insulating, but following graphene formation the substrate is conductive.

Additional features and advantages of the subject matter of the present disclosure will be set forth in the detailed description which follows, and in part will be readily apparent to those skilled in the art from that description or recognized by practicing the subject matter of the present disclosure as described herein, including the detailed description which follows, the claims, as well as the appended drawings.

It is to be understood that both the foregoing general description and the following detailed description present embodiments of the subject matter of the present disclosure, and are intended to provide an overview or framework for understanding the nature and character of the subject matter of the present disclosure as it is claimed. The accompanying drawings are included to provide a further understanding of the subject matter of the present disclosure, and are incorporated into and constitute a part of this specification. The drawings illustrate various embodiments of the subject matter of the present disclosure and together with the description serve to explain the principles and operations of the subject matter of the present disclosure. Additionally, the drawings and descriptions are meant to be merely illustrative, and are not intended to limit the scope of the claims in any manner.

BRIEF DESCRIPTION OF THE DRAWINGS

The following detailed description of specific embodiments of the present disclosure can be best understood when read in conjunction with the following drawings, where like structure is indicated with like reference numerals and in which:

FIG. 4a and FIG. 4d are SEM micrographs of an LAS glass-ceramic substrate comprising nanoscale islands of nickel, and FIG. 4b and FIG. 4c are SEM micrographs of graphene formed over the substrate of FIG. 4a;

DETAILED DESCRIPTION

Figure 1:
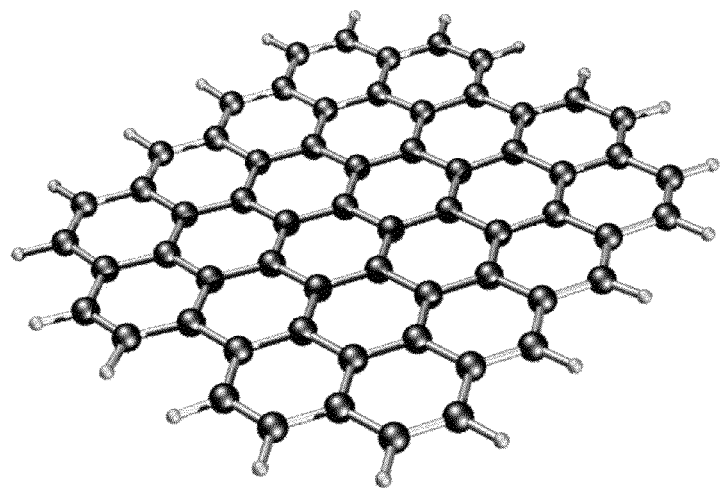
FIG. 1 is a schematic showing the structure of graphene.

Reference will now be made in greater detail to various embodiments of the subject matter of the present disclosure, some embodiments of which are illustrated in the accompanying drawings. The same reference numerals will be used throughout the drawings to refer to the same or similar parts.

A substrate for graphene growth comprises a glass-ceramic body, and plural nanophase metallic islands disposed on a surface of the body. In a chemical vapor deposition process for forming graphene, the metallic islands catalyze graphene growth. The metallic islands are created by thermal reduction of corresponding metal oxide islands that are formed by thermally-induced diffusion, for example, during crystallization of the glass-ceramic. Single layer and double layer graphene can be formed on the substrate via catalytic decomposition of a hydrocarbon precursor.

The disclosed graphene synthesis uses an insulating (glass-ceramic) substrate. Suitable glass-ceramics include lithium aluminosilicate (LAS) materials such as spodumene materials. Example LAS compositions are summarized in Table 1.

TABLE 1

Glass-ceramic substrate compositions

| Composition | Example 1 (mol %) | Example 4 (mol %) |
|---|---|---|
| $Al_2O_3$ | 12.38 | 12.38 |
| $Li_2O$ | 6.06 | 6.06 |
| MgO | 2.89 | 2.89 |
| SiO2 | 74.24 | 74.24 |
| BaO | 0.32 | 0.32 |
| ZnO | 0.8 | 0.8 |
| $ZrO_2$ | 0.95 | 0.95 |
| $SnO_2$ | 0.25 | 0.25 |
| NiO | 5 | 0 |
| $Co_3O_4$ | 0 | 1.67 |
| $TiO_2$ | 2.11 | 2.11 |

The glass-ceramic substrates include a non-glass forming, non-glass-modifying metal such as nickel or cobalt, which is incorporated into the glass-ceramic as a corresponding oxide, and which is segregated during thermal treatment to form islands of metal oxide, such as nickel oxide (e.g., NiO) or cobalt oxide (e.g., $Co_3O_4$) on the glass-ceramic surface. Glass-ceramic compositions comprising nickel oxide include at least 1 mol % NiO (e.g., 1, 2, 3, 4 or 5 mol % NiO). Glass-ceramic compositions comprising cobalt oxide include at least 0.33 mol % NiO (e.g., 0.33, 0.66, 1, 1.33, 1.66 or 2 mol % $Co_3O_4$). Other metals capable of forming surface nanoparticles that can be incorporated into the glass-ceramic include Cu, Pt, Au, Rd, Ru, Ir and Fe. If used, 0.5, 1, 2, 3, 4 or 5 mol % of corresponding metal oxides can be incorporated into the glass-ceramic. In embodiments, two or more such metals may be incorporated into the glass-ceramic.

Raw materials for forming the glass-ceramic substrate are melted and then quenched to form glass. The glass is heated to induce nucleation and growth of crystallites and form the glass-ceramic. Raw materials can be melted to form glass at 1500° C. or greater (e.g., 1500, 1550, 1600, 1650 or 1700° C.). The quenched glass is heated to a crystallization temperature in the presence of oxygen (e.g., air, oxygen, or an oxygen-containing gas). Suitable crystallization temperatures to form a glass-ceramic are 800° C. or greater (e.g., 800, 900, 1000 or 1100° C.). In embodiments, the crystallization temperature can correspond to a graphene growth temperature. During ceramming, a metal such as nickel or cobalt migrates under the influence of its redox potential to the glass-ceramic surface to form metal oxide particles on the glass-ceramic surface.

Discrete metallic islands can be formed from the metal oxide islands by heat-treating the glass-ceramic in a reducing environment. For example, nickel metal islands are formed via NiO reduction and cobalt metal islands are formed via $Co_3O_4$ reduction. Although the metallic islands are individually conductive, the surface of the glass-ceramic and hence the glass-ceramic substrate is non-conductive because, in embodiments, the metallic islands are not interconnected.

A graphene layer can be formed on the glass-ceramic substrate using a CVD graphene growth process. CVD growth of graphene can be carried out by exposing the metallic island-containing glass-ceramic surface to a carbon precursor such as $C_2H_2$, $CH_4$ or other hydrocarbon in conjunction with a reducing agent such as $H_2$ at elevated temperature under vacuum or at atmospheric pressure. A graphene-formation temperature can be at least 800° C., for example at least 900° C.

Under CVD conditions, the metal (e.g., Ni or Co) islands can catalyze the formation of graphene. The high-temperature graphene growth conditions may induce the migration and/or recrystallization of the metallic nanoparticles on the glass-ceramic surface, especially in the presence of carbon atoms and/or hydrocarbon species that result from partial decomposition of the carbon source. In addition to catalyzing the formation of graphene, surface mobility of the metallic islands may promote the coalescence of graphene domains, resulting in a graphene film that covers all or substantially the entire glass-ceramic surface, including the metallic particles. As a result, in embodiments, the graphene-coated glass-ceramic substrate is conductive.

Figure 2:
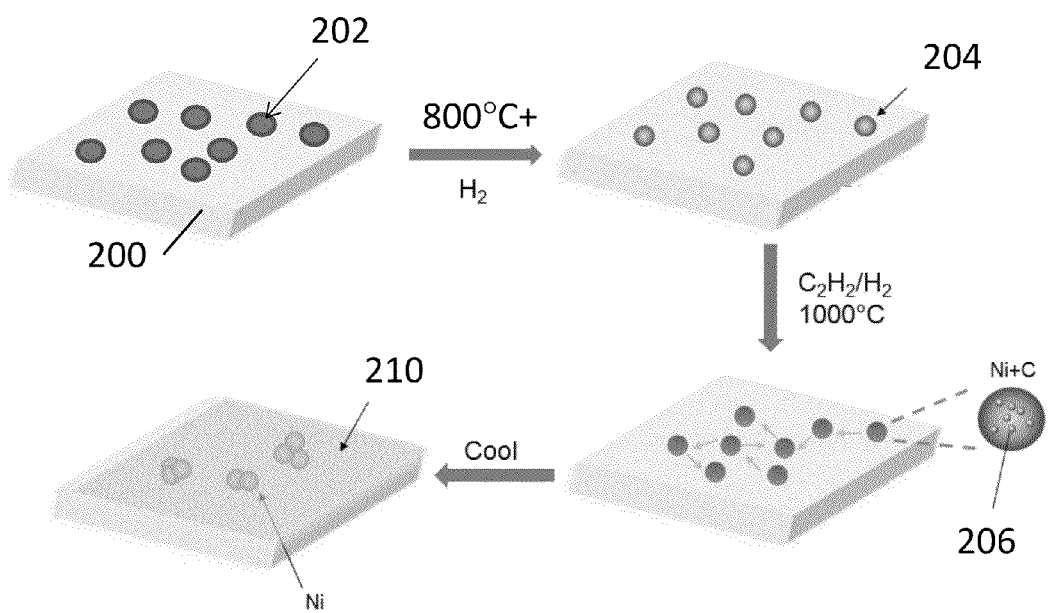
FIG. 2 is an illustration of a graphene forming method according to embodiments.

A schematic illustrating a mechanism of graphene growth on a glass-ceramic substrate is shown in FIG. 2. During a crystallization heat treatment of the parent glass, metal oxide particles 202 form on the surface of a glass-ceramic substrate 200 where they are subsequently reduced to elemental metal nanoparticles 204. A carbon precursor (e.g., $C_2H_2$) is exposed to the nanoparticle-containing glass-ceramic surface in a CVD process under reducing conditions (e.g., $H_2$ at 1000° C.) where the carbon precursor decomposes to form elemental carbon that alights on the glass-ceramic surface and on the metal particles. Decomposition of the carbon precursor and the formation of graphene may be catalyzed by the metal.

In embodiments, carbon atoms may coalesce to form graphene over the nanoparticles and over the glass-ceramic surface. Incident to the formation of graphene domains, carbon may diffuse into the metallic islands. For instance, carbon atoms may diffuse into the metal particles to form metallic particles having carbon dissolved therein 206, which themselves may recrystallize and/or migrate over the glass-ceramic surface. During cooling of the glass-ceramic substrate, the solubility limit of carbon in the metal nanoparticles decreases and carbon atoms may be expelled from the metal nanoparticles and form graphene 210.

In various embodiments, one or more of the glass-ceramic composition, metallic island composition, substrate morphology including surface roughness, transition metal reduction, and graphene growth conditions can be optimized to form a graphene-coated substrate suitable for different applications. The method can be used to form large-scale, high-quality (low-defect) graphene.

Graphene-coated substrates may be conductive. The conductivity is attributable to a continuous conductive graphene layer and not to the underlying glass-ceramic or nanoscale metallic particles.

The glass-ceramic substrate may be planar or shaped. It may have a smooth or rough surface or may contain a surface pattern or relief structure. An example glass-ceramic substrate is a honeycomb substrate. With such a substrate, graphene may be formed within at least some of the channels, e.g., on the channel walls.

As used herein, a honeycomb structure is a porous monolithic body having a plurality of parallel cell channels bounded by solid or porous channel walls that traverse the body from an upstream end to a downstream end. The geometric shape of the cell channels is not particularly limited and may include, for example, squares, triangles, rectangles, hexagons, octagons, circles, ovals, slits, or any combination of these or similar shapes.

The channel density of the honeycombs can range from 6 cells per square inch (cpsi) to 1200, 1600 or even 2000 cpsi. The wall thickness between the channels can range from 0.001 inch to 0.200 inch, e.g., 0.02 inch to 0.08 inch, for example 0.050 inch.

The diameter of a honeycomb monolith can range, for example, from about 1 inch to about 30 inches, e.g., from 3 to 15 inches. The body length of the monolith can range from 0.2 inches to 100 inches, e.g., 0.5 to 20 inches.

EXAMPLES

Example 1

Single/Bi-Layer Graphene Growth on Ni-Containing Glass-Ceramics

A glass-ceramic substrate having the composition summarized in Table 1 (Example 1) is heat-treated in air at 750° C. for 2 hr, followed by 850° C. for 4 hr. The sample is then heated in $H_2$ at ambient pressure at 450° C. for 5 hr.

Figure 3:
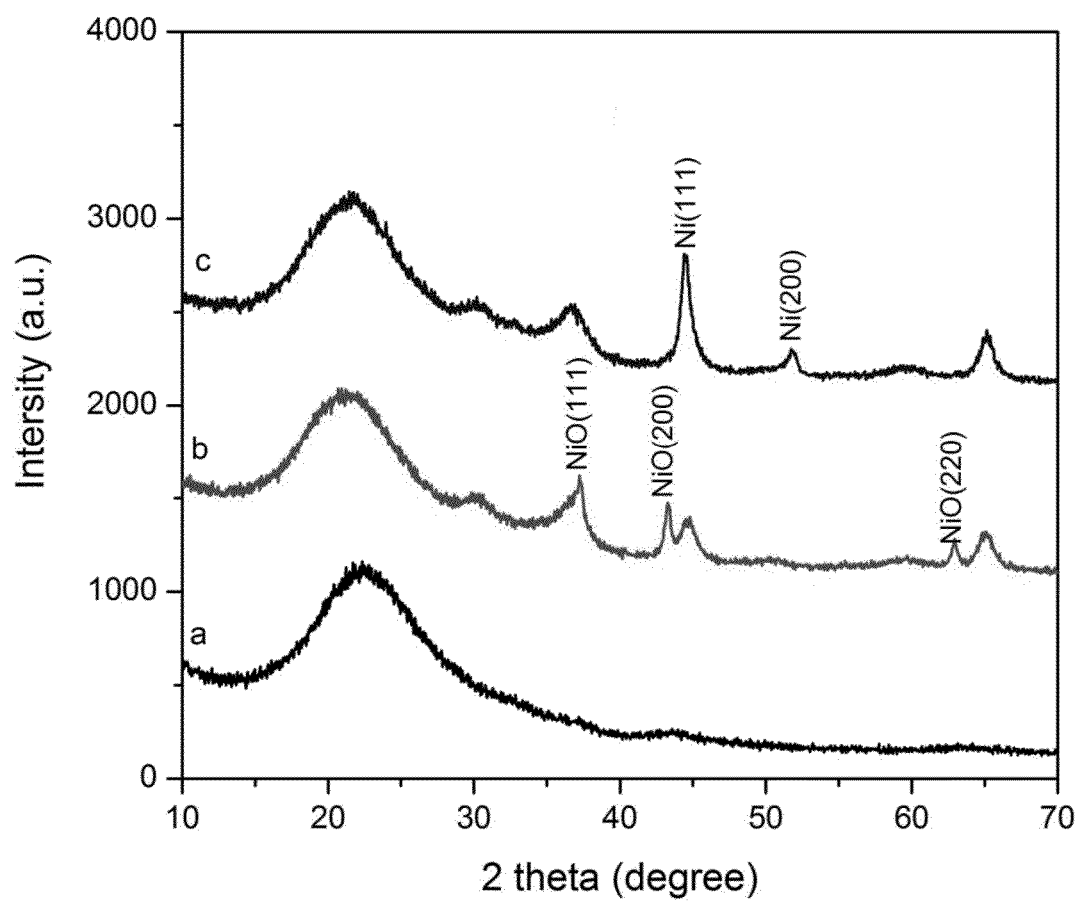
FIG. 3 is glancing angle x-ray diffraction data for a glass-ceramic substrate: (a) as-prepared, (b) after heating in air, and (c) after heating in air and then in hydrogen.

Glancing angle x-ray diffraction (XRD) data from the surface of the glass-ceramic (a) as-prepared, (b) after heating in air, and (c) after heating in hydrogen are shown in FIG. 3.

Reflections that index to NiO appear following oxidation, and reflections that index to metallic Ni are observed after $H_2$ reduction. In FIG. 3c, peaks located at 44.35° and 51.33° correspond to face-centered cubic Ni (111) and Ni (200), respectively.

Figure 4:
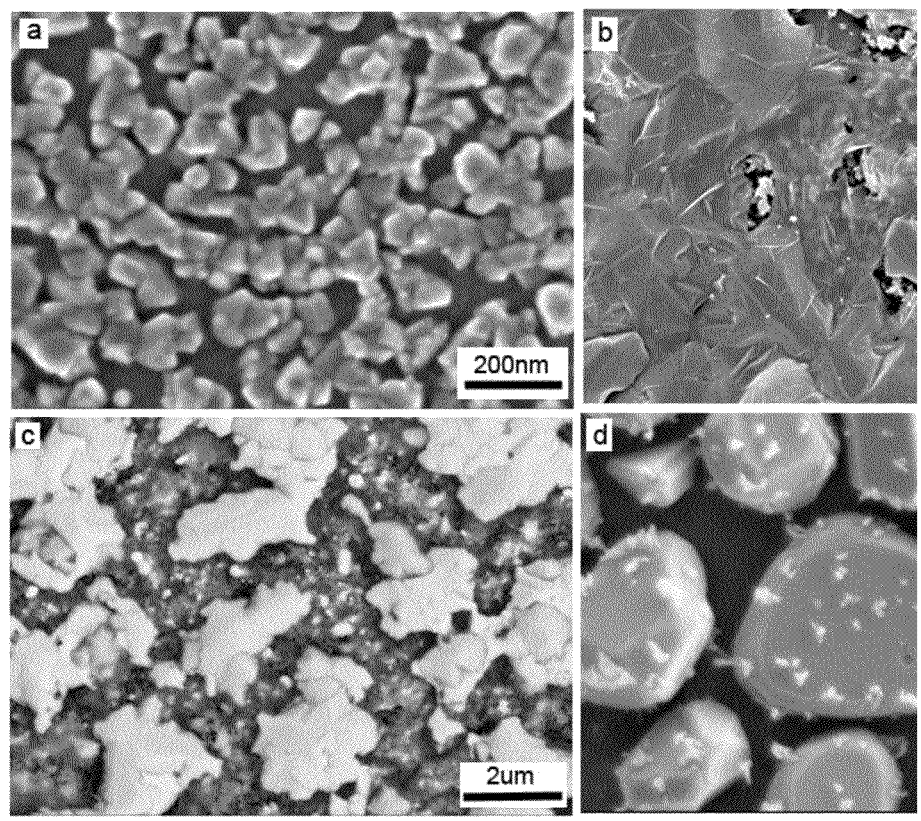

A scanning electron microscope (SEM) micrograph of the glass-ceramic surface showing 50-100 nm Ni nanoparticles on the surface is shown in FIG. 4a. The metal nanoparticles comprise a plurality of discrete islands. A surface conductivity measurement shows the sample to be non-conductive.

The glass-ceramic substrate comprising islands of metallic nickel is loaded into a CVD reactor. An initial thermal treatment at 1000° C. and $5 \times 10^{-4}$ Torr in $H_2$ for 1 hr was carried out to remove oxygen or any oxidizing reagent from the system.

CVD growth was performed with $C_2H_2$ and $H_2$ ($C_2H_2$:$H_2$=2:1) at $5 \times 10^{-4}$ Torr for 1 hr at 1000° C. After the elevated-temperature exposure, the CVD chamber was cooled to 25° C. in the presence of the CVD gas mixture.

The graphene film morphology is shown in FIG. 4b. It is apparent that graphene forms not only on top of the Ni particles, but it also bridges inter-particle gaps. The sheet resistance post-graphene formation is 3.4-13.2 k$\Omega$/square, which is consistent with a nearly continuous film of graphene deposited over the glass-ceramic surface.

A post-graphene deposition backscattered electron image is shown in FIG. 4c. The backscattered image is highly sensitive to atomic number and thus provides elemental resolution. FIG. 4c shows the morphology of the Ni particles under the graphene film.

Compared to FIG. 4a, FIG. 4c shows a significant increase in the size and change in the shape of the Ni particles following CVD of graphene. This is consistent with surface migration of the Ni islands during the graphene growth.

In a related (control) experiment, FIG. 4d shows the impact on the nickel particles of a CVD-like process (identical thermal conditions as the CVD deposition process, but without introducing any hydrocarbon into the chamber). The result depicted in FIG. 4d is consistent with a conclusion that the dynamic interaction of Ni and carbon source molecules or carbon atoms contributes to the migration of Ni islands on glass-ceramic surfaces.

Figure 5A:
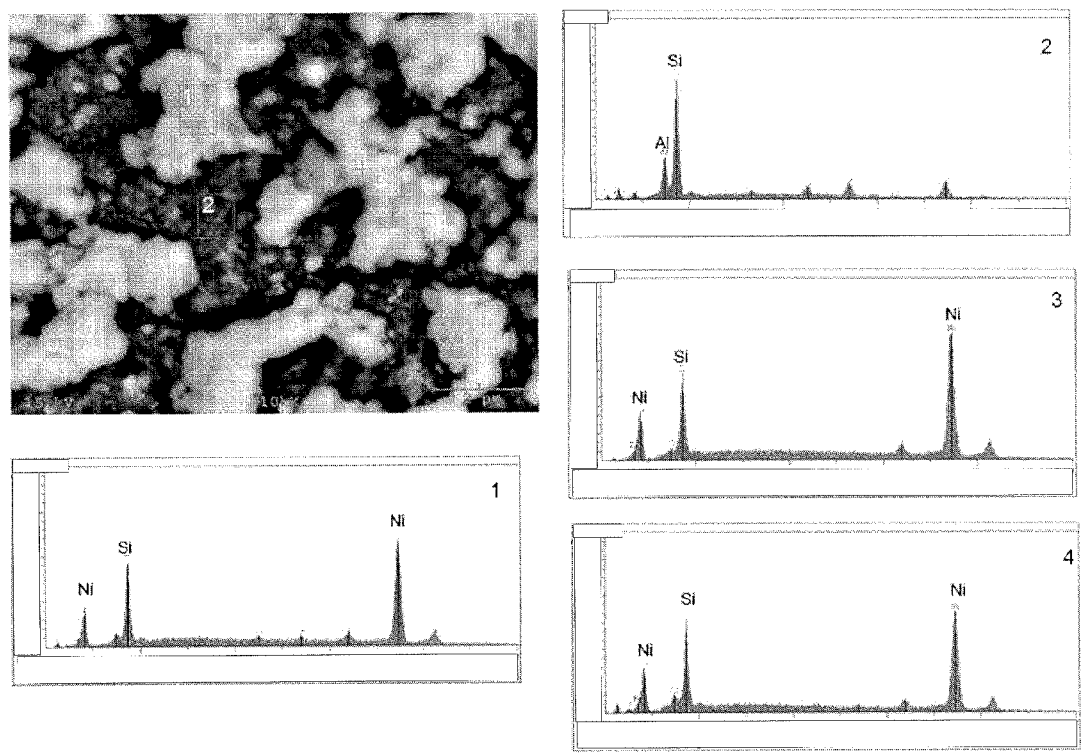
FIGS. 5a and 5b are backscattering SEM micrographs and corresponding energy dispersive x-ray (EDX) spectra for glass-ceramic substrates after graphene growth.
Figure 5B:
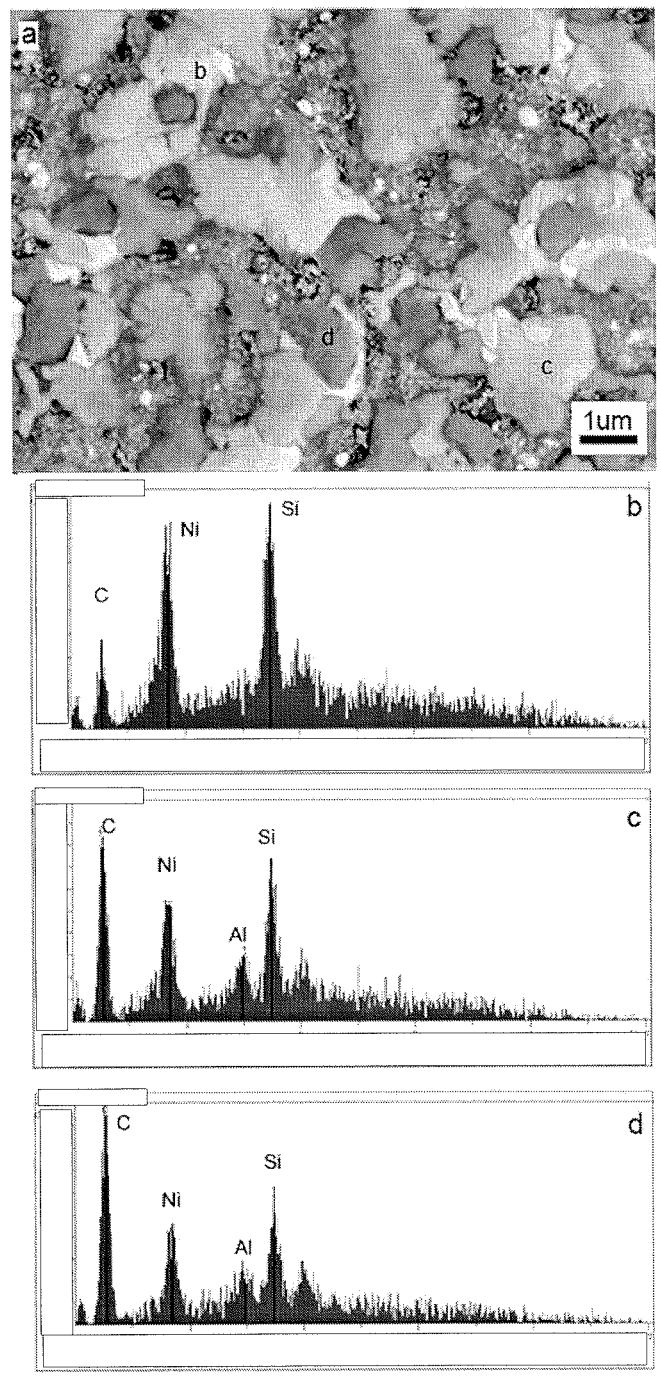

FIGS. 5a and 5b are further backscattered SEM image showing isolated nickel nanoparticles following graphene growth. Energy dispersive x-ray spectrometry (EDX) corresponding to regions 1-4 in FIG. 5a clearly shows that the light contrast regions are rich in nickel while the dark contrast regions between the nickel particles are LAS glass-ceramic. Regions (b-d) in FIG. 5b each contain carbon.

Raman spectroscopy was used to characterize graphene. Observable Raman bands include a defect band (D band), a band related to in-plan vibration of $sp^2$ carbon (G band), and a stacking order (2D or G' band). For monolayer graphene, the G band is located at ~1580 cm$^{-1}$, and a sharp and symmetric 2D band is located at ~2700 cm$^{-1}$. The 2D band becomes broader and shifts to the blue as the graphene thickness increases.

Typical of monolayer graphene are (i) a G/2D intensity ratio of about 0.5; and (ii) a symmetric 2D peak centered at ~2700 cm$^{-1}$ with a full width at half maximum of ~33 cm$^{-1}$. As the number of graphene layers increases, a significant decrease in the relative intensity of the 2D band is observed, which results in an increase in the G/2D ratio. With increased graphene layer thickness, the 2D peak becomes increasingly asymmetric. For greater than 5 graphene layers, the Raman spectrum is hardly distinguished from bulk graphite.

The formation of graphene on glass-ceramic substrates via CVD growth was confirmed by micro-Raman spectroscopy. Raman spectra were measured on a Renishaw confocal Raman spectroscope with laser wavelength of 514 nm, 100×, spot size ~0.5 um, scan area 30 um×30 um at 1 um/step. Raman spectra showing D, G and 2D bands are shown in FIG. 6a.

A G/2D intensity ratio of less than 1 is considered a fingerprint of monolayer graphene, while a G/2D intensity ratio of greater than 1 is typical for bi-layer or plural graphene layers.

Figure 6:
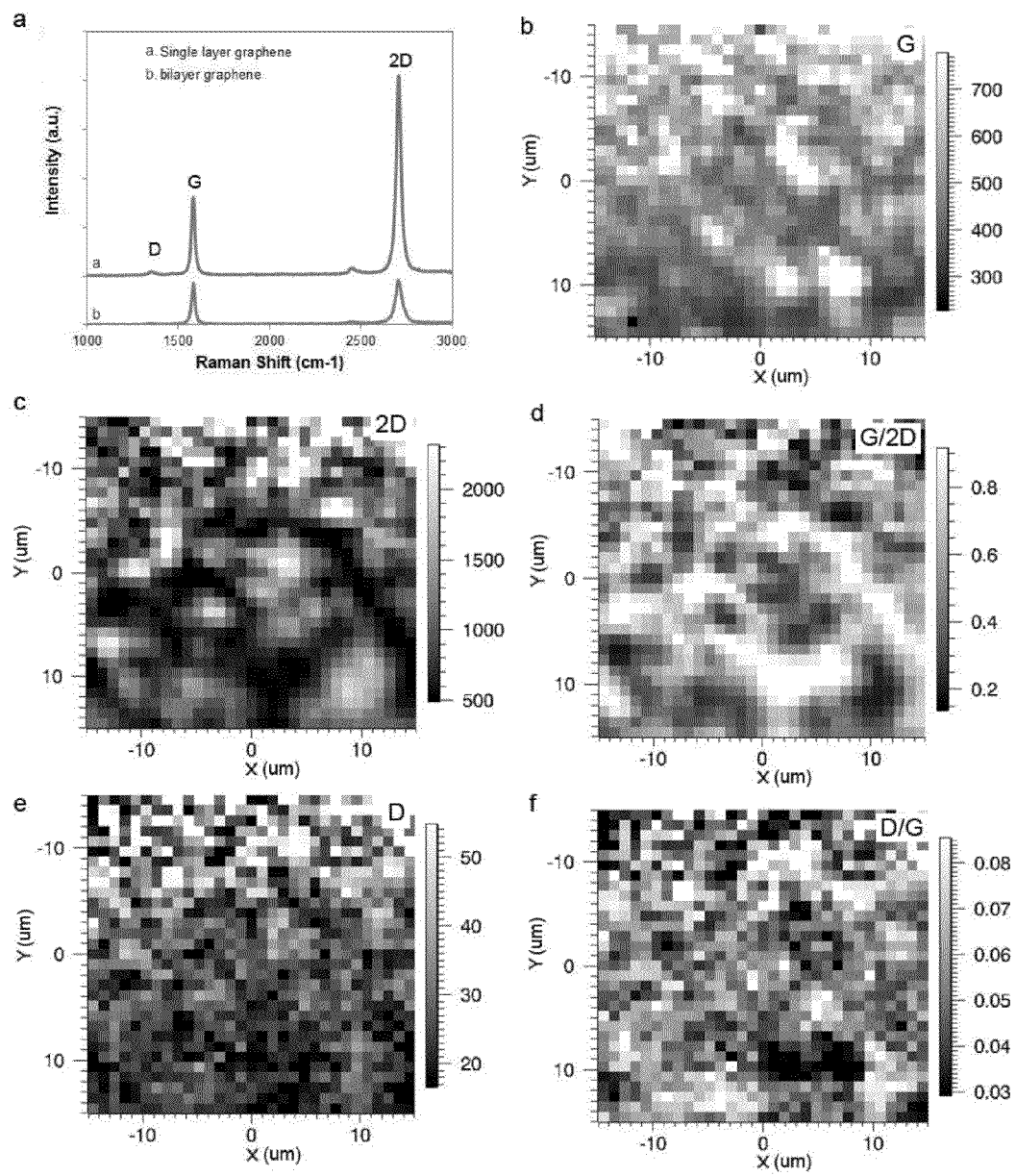
FIG. 6a through 6f show Raman spectra and corresponding Raman spectra-derived maps of graphene formed over a glass-ceramic substrate.

The upper trace in FIG. 6a shows Raman features typical of monolayer graphene. The G band is at 1581 cm$^{-1}$, and a single, sharp, symmetric 2D band is at 2706 cm$^{-1}$. The FWHM of the 2D band is about 30 cm$^{-1}$ and the G/2D ratio is 0.39. The lower trace in FIG. 6a shows Raman features typical of bi-layer graphene. The 2D FWHM is about 34 cm$^{-1}$ and the G/2D ratio is 1.09.

The G band and 2D band intensities (as well as their ratio) can be used to product a Raman map of a given area. Such Raman maps are shown in FIGS. 6b-6d, which show G, 2D and G/2D ratios, respectively (color not provided).

The D band (~1350 cm$^{-1}$) intensity mapping was also measured (FIG. 6e). A low D/G ratio indicates the absence of a significant number of defects (FIG. 6f).

Example 2

In-situ Growth of Graphene on Glass-Ceramics Without Pre-Reduction

The Example 1 glass-ceramic substrate was heated in air at 780° C. for 2 hr, and then at 1000° C. for 2 hr to form nickel oxide. No pre-reduction in hydrogen gas was performed prior to graphene growth.

Figure 7:
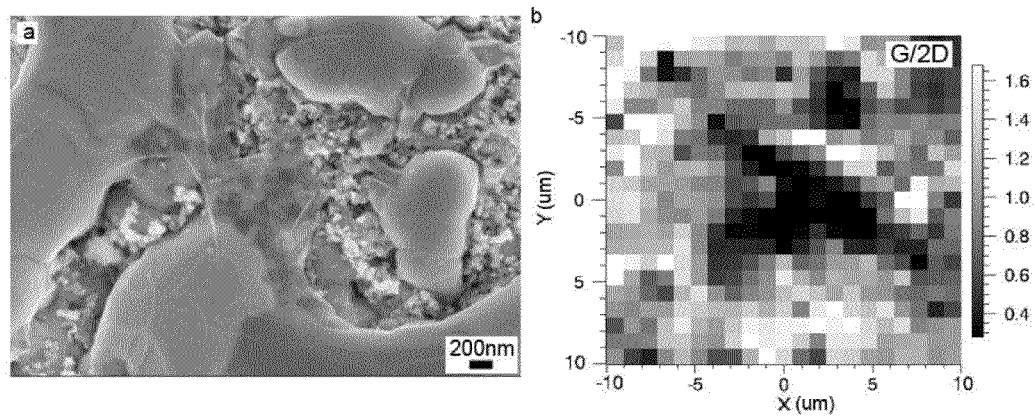
FIG. 7 is (a) an SEM micrograph and (b) a corresponding Raman spectrum map of graphene formed over a glass-ceramic substrate.

Graphene was grown without pre-reduction at CVD conditions of 1000° C. and $5 \times 10^{-5}$ Torr in $C_2H_2/H_2$. The in situ reduction of nickel oxide to nickel metal is believed to have occurred during the CVD growth as a result of the CVD growth conditions. An SEM micrograph and Raman spectra map are shown in FIG. 7a and FIG. 7b, respectively. Color drawings for the Raman maps are not provided.

Example 3

Graphene Growth on Ni Glass-Ceramics Thermally-Treated in $N_2$

Figure 8:
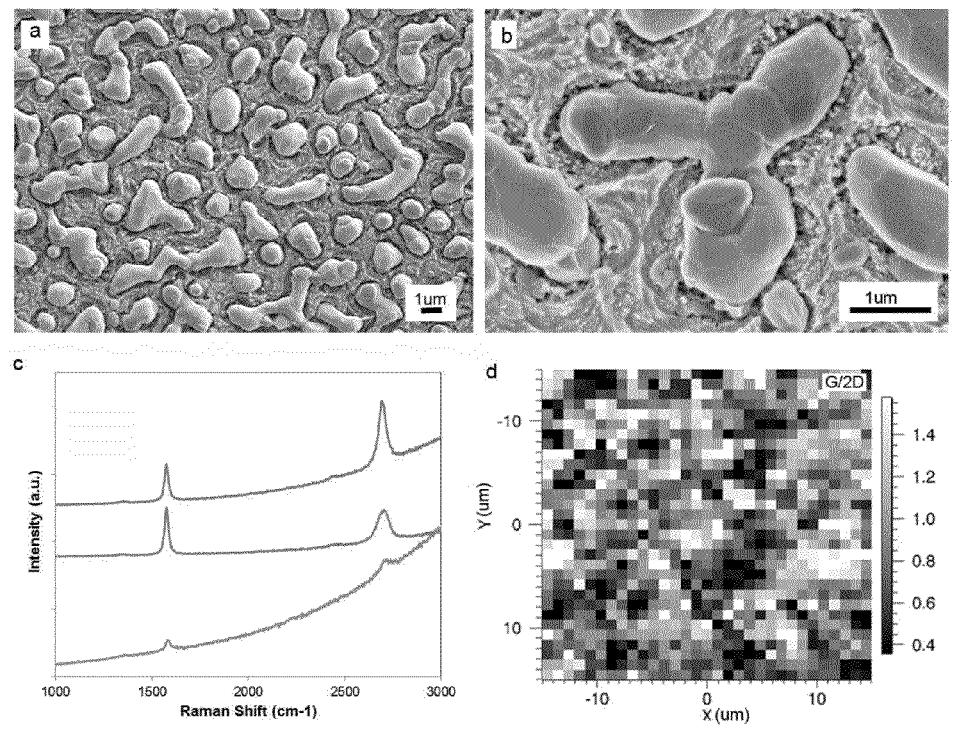
FIG. 8 shows (a-b) SEM micrographs of graphene locally-formed over a glass-ceramic substrate, (c) related Raman spectra, and (d) a corresponding Raman spectrum map.

FIG. 8 shows data for graphene grown on the Example 1 glass-ceramic substrate, which was heat-treated in nitrogen at 780° C. for 2 hr, followed by 1000° C. for 2 hr. The sample is then heated in $H_2$ at ambient pressure at 450° C. for 5 hr. Graphene was formed following the pre-reduction in hydrogen at CVD conditions of 1000° C. and $5 \times 10^{-5}$ Torr in $C_2H_2/H_2$.

As seen with reference to the SEM micrographs in FIG. 8a and FIG. 8b, graphene was formed primarily on the surface of localized Ni particles. The Ni particles were formed in situ during the graphene growth. Raman spectra (FIG. 8c) show G and 2D peaks for graphene formed on the Ni particles (top two curves). The lower curve shows only weak Raman reflections for areas of the surface between the Ni particles. In FIG. 8d, most G/2D ratio (>0.5) mapping indicates that the graphene growth (and graphene thickness) is not uniform across the surface. Monolayer and primarily bilayer graphene is formed. The Example 3 substrate was not conductive.

Example 4

Graphene Growth on Co-Containing Glass-Ceramics

A cobalt oxide-containing glass-ceramic substrate having the composition summarized in Table 1 (Example 4) is heat-treated in air at 780° C. for 2 hr, followed by 1000° C. for 2 hr. The sample is then heated in $H_2$ at ambient pressure at 450° C. for 5 hr.

CVD growth was performed with $C_2H_2$ and $H_2$ ($C_2H_2$:$H_2$=2:1) at $5\times10^{-4}$ Torr for 1 hr at 1000° C. After the elevated-temperature exposure, the CVD chamber was cooled to 25° C. in the presence of the CVD gas mixture.

Figure 9:
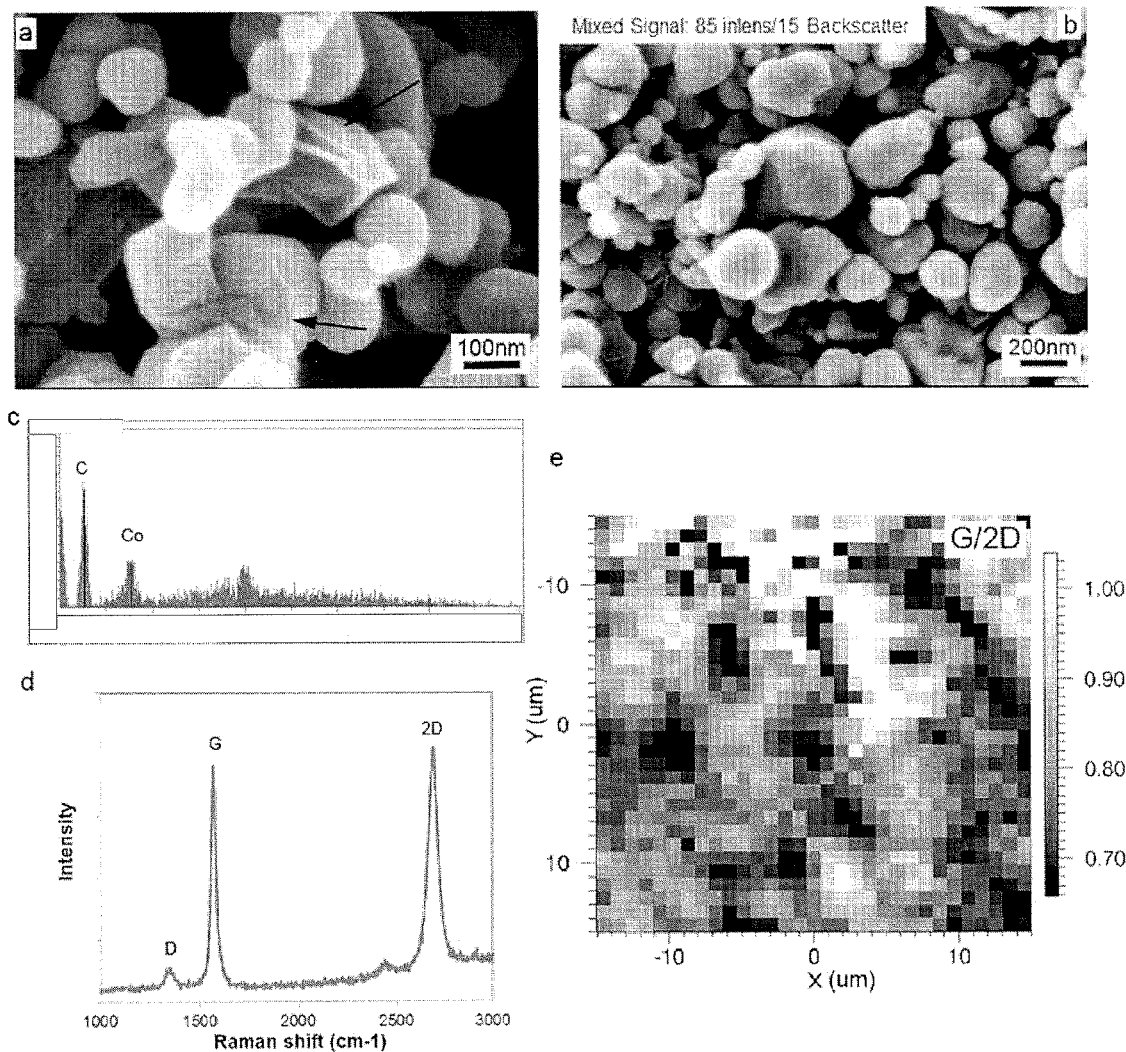
FIG. 9 shows (a-b) SEM micrographs, (c) an EDX spectrum, (d) a Raman spectrum and (e) a corresponding Raman spectrum map of graphene formed over a glass-ceramic substrate.

Graphene formed as localized thin films that enveloped individual cobalt nanoparticles (see arrows in the SEM micrograph of FIG. 9a). By mixing secondary electron and backscattered electron signals, no significant contrast was detected suggesting uniform graphene stacking layers (FIG. 9b). The EDX data in FIG. 9c confirms carbon and cobalt as the main constituents in the sample surface, which is consistent with the Raman spectra results (FIG. 9d and FIG. 9e). Over the measured sample area, the G/2D ratio is approximately 1. A small defect peak appears at about 1348 $cm^{-1}$, suggesting that the graphene comprises edges and disorder structures, which may be the result of surface roughness of the Co particles on the glass-ceramic.

In the disclosed method, discrete metallic islands rather than a continuous metal layer are used to catalyze the graphene growth. A method for forming graphene comprises exposing a surface of a glass-ceramic substrate to a carbon precursor, where the surface comprises plural nanophase metallic islands.

In embodiments, a device may be constructed on a conductive, graphene-coated substrate.

As used herein, the singular forms "a," "an" and "the" include plural referents unless the context clearly dictates otherwise. Thus, for example, reference to a "graphene layer" includes examples having two or more such "graphene layers" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein refer to a component being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a glass-ceramic substrate that comprises nanoscale particles include embodiments where a glass-ceramic substrate consists of nanoscale particles and embodiments where a glass-ceramic substrate consists essentially of nanoscale particles.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

We claim:

1. A substrate for graphene growth, comprising:
   a glass-ceramic body; and
   plural metallic islands disposed on a surface of the glass-ceramic body,
   wherein, carbon is incorporated into the metallic islands.

2. The substrate according to claim 1, wherein the glass-ceramic body comprises a lithium aluminosilicate glass-ceramic.

3. The substrate according to claim 1, wherein the metallic islands comprise an elemental metal selected from the group consisting of Ni, Co, Cu, Pt, Au, Rd, Ru, Ir and Fe.

4. The substrate according to claim 1, wherein the metallic islands have a lateral dimension of 50 to 500 nm.

5. The substrate according to claim 1, wherein the substrate is electrically insulating.

6. A substrate for graphene growth, comprising:
   a glass ceramic body; and
   plural metallic islands disposed on a surface of the glass-ceramic body, wherein the substrate comprises a glass-ceramic honeycomb.

7. A method for forming graphene, comprising:
   exposing a surface of a glass-ceramic substrate to a carbon precursor, wherein the surface comprises plural metallic islands.

8. The method according to claim 7, wherein the glass-ceramic comprises a lithium aluminosilicate.

9. The method according to claim 7, wherein the metallic islands comprise an elemental metal selected from the group consisting of Ni, Co, Cu, Pt, Au, Rd, Ru, Ir and Fe.

10. The method according to claim 7, wherein the metallic islands have a lateral dimension of 50 to 500 nm.

11. The method according to claim 7, wherein the substrate is electrically insulating.

12. The method according to claim 7, wherein the carbon precursor is exposed to the surface in a reducing environment.

13. The method according to claim 7, where the metallic islands are formed by heating the glass-ceramic substrate in a reducing environment prior to exposing the carbon precursor to the surface.

14. The method according to claim 7, wherein the graphene comprises a monolayer of carbon.

15. The method according to claim 7, wherein the graphene comprises a bilayer of carbon.

16. The method according to claim 7, wherein the graphene comprises a substantially continuous layer.

17. A graphene-coated substrate comprising:
   a glass-ceramic body;
   plural metallic islands disposed on a surface of the glass-ceramic body; and
   a graphene layer disposed over the metallic islands.

18. The graphene-coated substrate according to claim 17, wherein the graphene comprises a monolayer of carbon.

19. The graphene-coated substrate according to claim 17, wherein the graphene comprises a substantially continuous layer.

20. The graphene-coated substrate according to claim 17, wherein the substrate is electrically conducting.

21. The graphene-coated substrate according to claim 17, wherein the substrate comprises a glass-ceramic honeycomb.

22. A device comprising the graphene-coated substrate according to claim 17.

\* \* \* \* \*